US007515084B1

(12) United States Patent
Cruz-Albrecht et al.

(10) Patent No.: US 7,515,084 B1
(45) Date of Patent: Apr. 7, 2009

(54) ANALOG TO DIGITAL CONVERTER USING ASYNCHRONOUS PULSE TECHNOLOGY

(75) Inventors: Jose Cruz-Albrecht, Oak Park, CA (US); Peter Petre, Oak Park, CA (US); Joseph F. Jensen, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/726,484

(22) Filed: Mar. 22, 2007

(51) Int. Cl.[8] ............................................. H03M 1/60
(52) U.S. Cl. ........................ 341/157; 341/155; 341/156
(58) Field of Search ........................ 341/143, 200, 155, 341/157, 156

(56) References Cited

U.S. PATENT DOCUMENTS 5,479,170 A * 12/1995 Cauwenberghs et al. .... 341/200
6,473,019 B1 * 10/2002 Ruha et al. .................. 341/143
6,975,682 B2 * 12/2005 Cosand ....................... 375/247

OTHER PUBLICATIONS

Cruz, J.M., et al., "A 16×16 Cellular Nueral Network Universal Chip: The First Complete Single-Chip Dynamic computer Array with Distributed Memory and with Gray Scale Input-Output," Analog Integrated Circuits and Signal Processing, 15, 227-237 (1998), month unknown.
Dighe, A.M., et al., "An Asynchronous Serial Flash Converter," 9th Int. Conf. On Electronics, Circuits and Systems, 2002, month unknown.
Lazar, A., et al., "Perfect Recovery and Sensitivity Analysis of Time encoded bandlimited signals," IEEE Trans. On circuits and Systems-I, vol. 51, No. 10, pp. 2060-2073 (Oct. 2004).
Roza, E., Analog to Digital Conversion via Duty cycle Modulation, IEEE trans. Ojn Circuits and Systems-II, vol. 44, No. 11, pp. 907-914 (Nov. 1997).
Walden, R., "Analog to Digital Converter Survey and Analysis," IEEE Journal on Selected Areas in Communications, vol. 17, No. 4, pp. 539-550 (Apr. 1999).

* cited by examiner

Primary Examiner—Jean B Jeanglaude
(74) Attorney, Agent, or Firm—Ladas & Parry, LLP

(57) ABSTRACT

A digital to analog converter includes a time encoder that converts an analog input signal into a asynchronous pulse sequence, a pulse asynchronous DeMUX circuit that converts the asynchronous pulse sequence into a parallel stream of pulse sequences at a relatively lower speed, a parallel pulse to asynchronous digital converter, an asynchronous digital to synchronous digital converter, a timing reference circuit to generate absolute time references, and a Digital Signal Processor. This architecture provides for analog to digital conversion based on pulse encoding with a parallel digitization scheme of the pulse encoded signal.

14 Claims, 15 Drawing Sheets

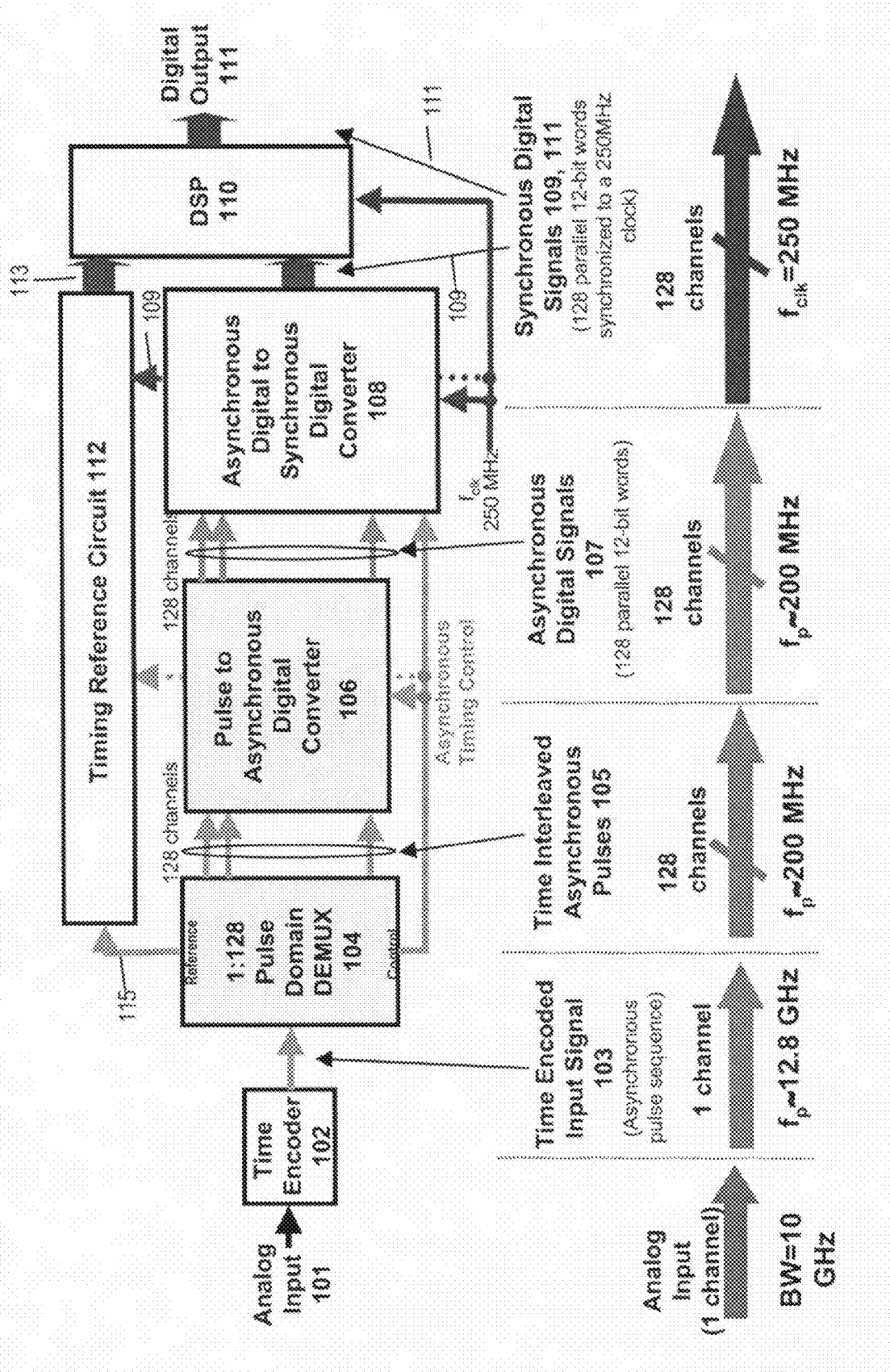

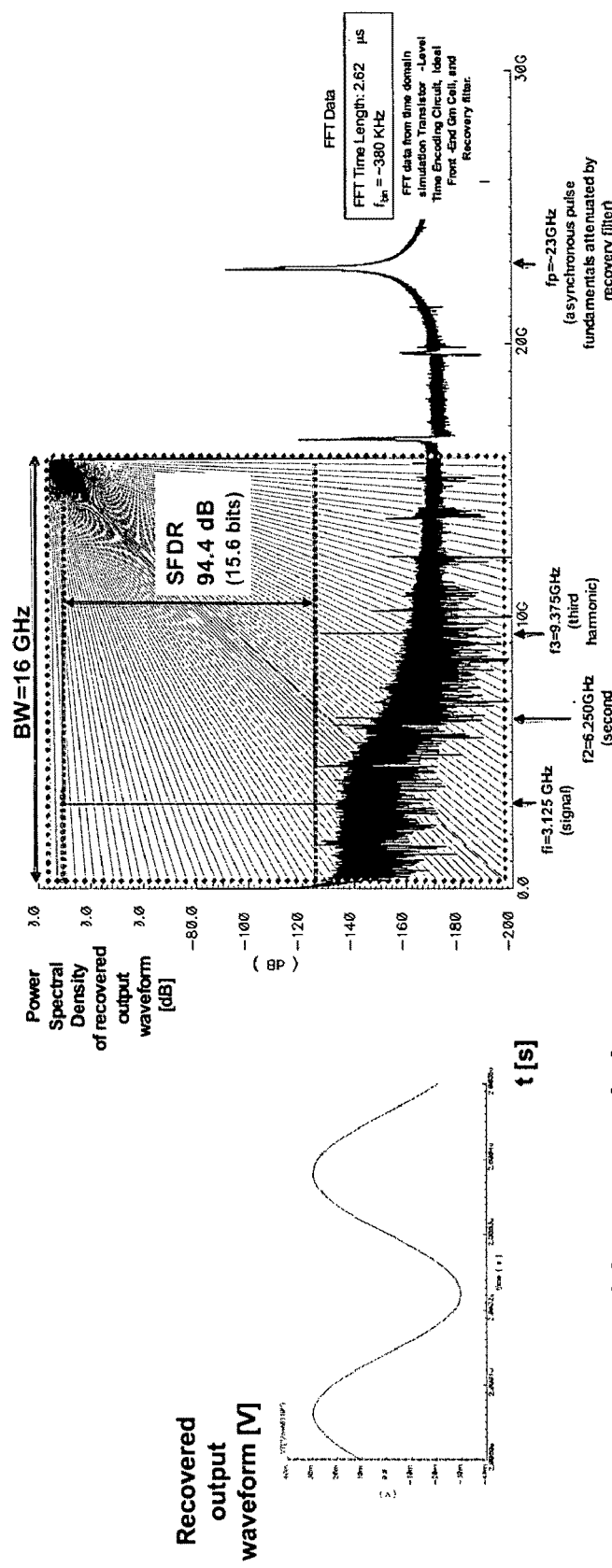

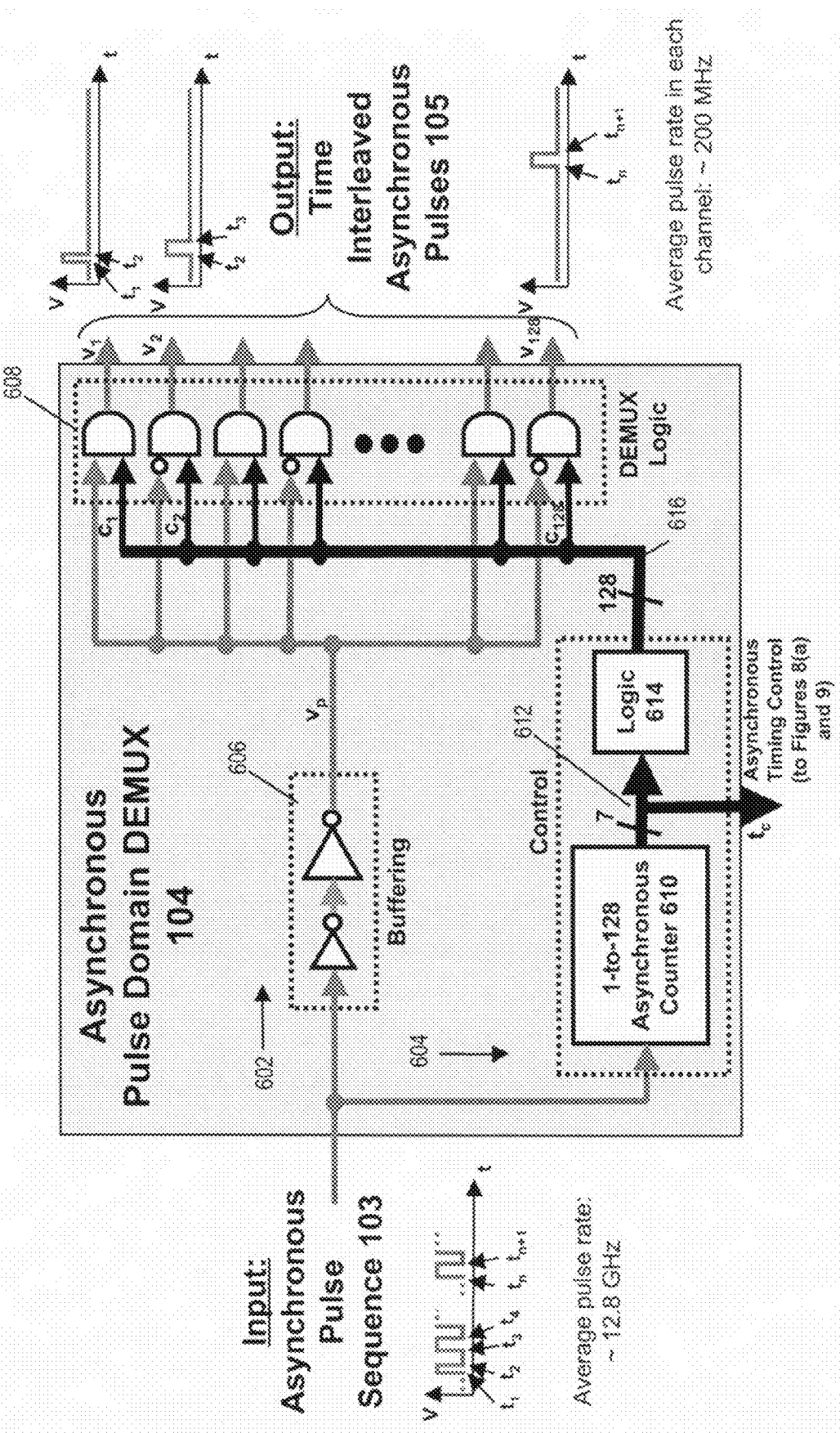

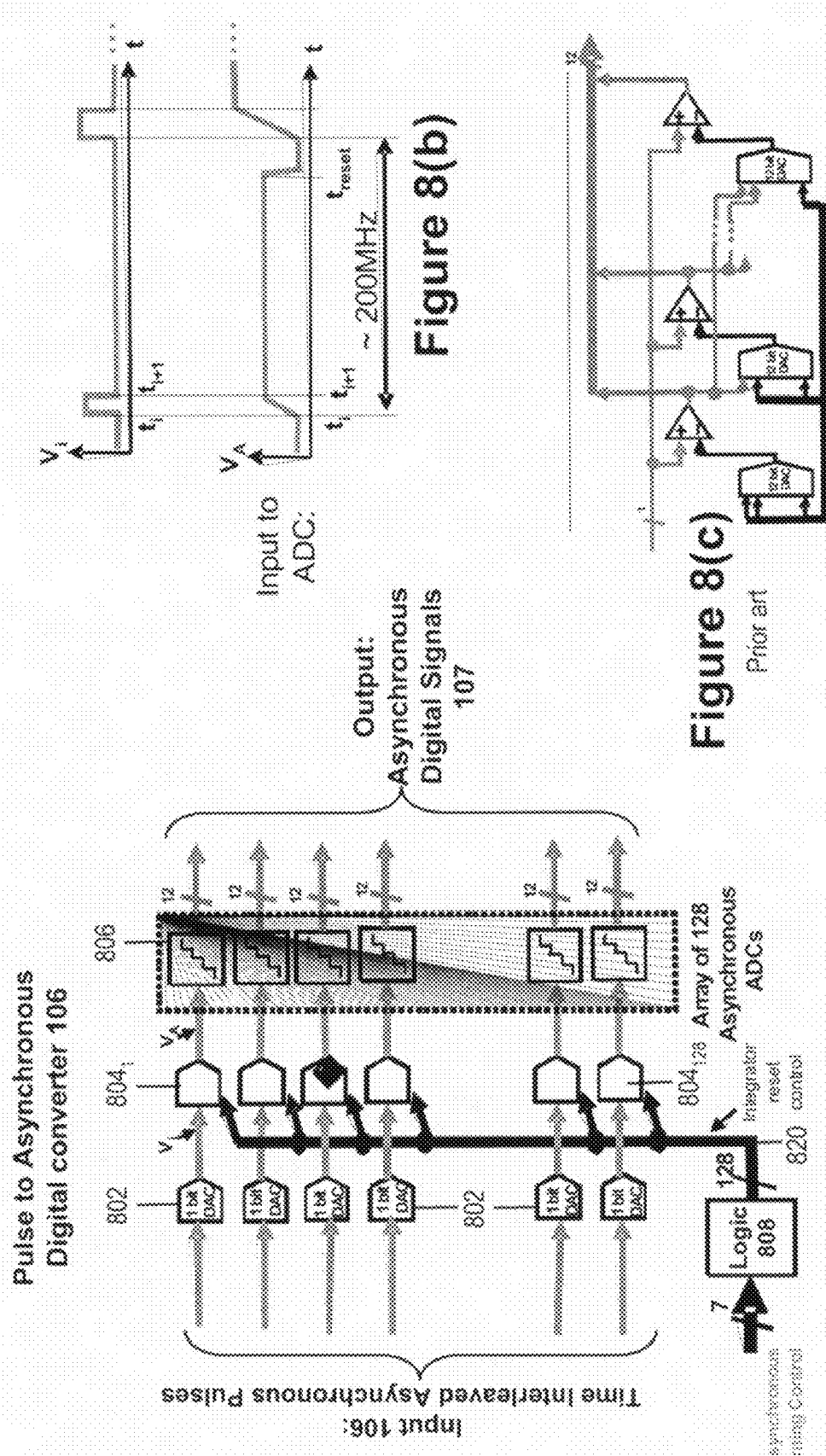
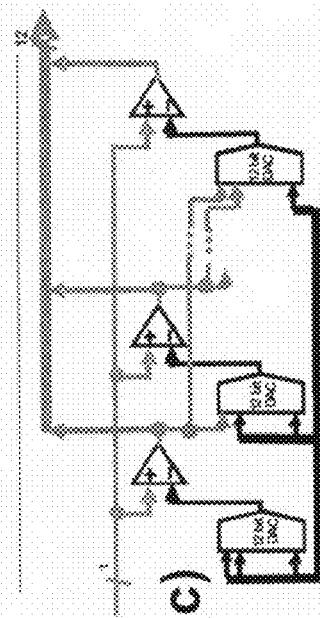
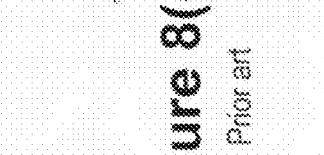
Figure 8(b)
Figure 8(c) Prior art
Figure 8(a)

ANALOG TO DIGITAL CONVERTER USING ASYNCHRONOUS PULSE TECHNOLOGY

TECHNICAL FIELD

This disclosure relates of an analog-to-digital converter architecture. It is based on encoding the analog data into an asynchronous time encoded pulse signal and then converting the pulse time encoded signal into a parallel digital signal.

BACKGROUND INFORMATION

The architecture of the disclosed system is composed of: (1) a front end time encoder that converts at high speed an analog input signal into a asynchronous pulse sequence, (2) a pulse asynchronous DeMUX circuit that converts the high speed asynchronous pulse sequence into a parallel stream of pulse sequences at lower speed, (3) a parallel pulse to asynchronous digital converter, (4) an asynchronous digital to synchronous digital converter, (5) a timing reference circuit to generate absolute time references, and (6) a Digital Signal Processor.

The disclosed architecture provides an analog to digital conversion based on pulse encoding with a parallel digitization scheme of the pulse encoded signal. This architecture with parallelization of pulses is believed to be new to the art. Also new are the following components: (1) An IC HBT time encoder, (2) a new transistor level topology to implement a differential hysteresis quantizer, (3) the pulse deMUX circuit, (4) the parallel pulse to asynchronous digital converter, (5) the asynchronous digital to synchronous digital converter, and (6) the timing reference circuit.

Particularly important features of this architecture includes: (1) providing a pulse demultiplexing scheme that is tolerant of jitter and offsets in control signals, (2) providing a digitization scheme in which individual pulses can be digitized at a lower speed than the input signal bandwidth. The disclosed pulse demultiplexing and parallel digitization allows achieving ultra wide bandwidth.

The disclosed technology allows one to do analog to digital conversion with a higher speed-resolution performance than existing ADC architectures. This is enabled by performing three basic operations: (1) time encoding the original signal into asynchronous pulses, (2) demultiplexing and (3) digitization.

The pulse demultiplexing allows using parallel circuits that can run at a lower speed than the input signal bandwidth. The complete circuit of the invention can digitize signals at higher speed than prior art ADCs for a given resolution. Preliminary simulations of important components show that the new architecture could be used to achieve 10 GHz bandwidth and 10 bit effective resolution, which is larger speed-resolution performance specification than previously reported ADCs. See R. Walden, "Analog-to-Digital Converter Survey and Analysis," IEEE Journal on Selected Areas in Communications, vol. 17, no. 4, pp. 539-550, April 1999.

With respect to the prior art, A. Lazar and L Toth in "Perfect Recovery and Sensitivity Analysis of Time Encoded Band-limited Signals," IEEE Trans. on Circuits and Systems—I, vol. 51, no. 10, pp. 2060-2073, October 2004 teach a single time encoder circuit limit cycle oscillator. In this paper it is shown that an analog input signal can be converted into an asynchronous pulse sequence, and that the original input can be recovered from the pulse sequence. However, this paper is limited to study the transformation from analog domain into the pulse domain and back. No attempt is made to build an analog-to-digital converter.

E. Roza, in "Analog-to-Digital Conversion via Duty Cycle Modulation," IEEE trans. on Circuits and Systems—II, vol. 44, no. 11, pp 907-914, November 1997 teaches a duty cycle analog to digital to digital converter architecture. However, in this architecture the conversion from pulse into digital is based simply on directly sampling the pulse signal in a synchronous way. This simple direct sampling process introduces potentially large quantization errors that are only mitigated by significantly over-sampling the synchronous clock to respect the asynchronous pulse sequence or by using polyphase samplers. The input signal bandwidth needs to be much lower (typically by a factor as large as 1000) than the speed of synchronous sampling circuitry or the speed of basic inverter delay stages, which is limited for any given technology. The present disclosure uses a different digitization scheme without over-sampling and with pulse data parallelism and the input signal bandwidth can be much higher (typically by a factor of 60) than the speed of the synchronous digital circuitry. For a given speed of the synchronous circuitry the present circuit can achieve an input bandwidth several orders of magnitude larger than the scheme of E. Roza.

BRIEF DESCRIPTION OF THE DRAWINGS

FIG. 1 shows an embodiment of the Analog-To-Digital Converter (ADC) Architecture according to a preferred embodiment of the invention.

FIGS. 5(a) and 5(b) shows an example of SFDR simulation for the circuits of FIGS. 3(a)-3(c).

FIG. 6 shows a schematic diagram of a preferred embodiment of the pulse domain deMUX of FIG. 1.

FIG. 8(a) shows a schematic diagram of a preferred embodiment of the pulse to asynchronous digital converter of FIG. 1.

FIG. 8(b) depicts waveforms at channel i of the pulse to asynchronous digital converter of FIG. 8(a).

FIG. 8(c) depicts a prior art asynchronous analog-to-digital converter which may be used in the pulse to digital converter of FIG. 8(a).

DETAILED DESCRIPTION

Figure 2B:
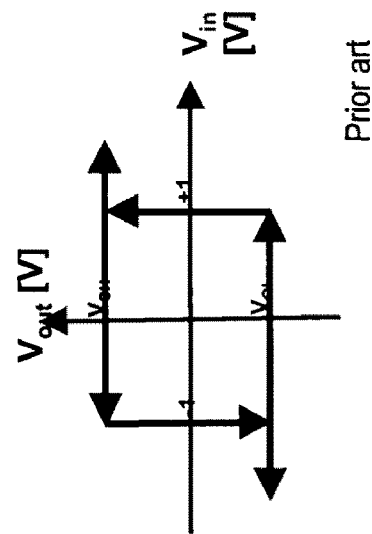
FIG. 2(b) shows a graph of the output-input characteristic of an ideal hysteresis quantizer.

FIG. 1 shows an embodiment of the Analog-To-Digital Converter (ADC) Architecture 100 of the invention. The ADC architecture is composed of the following six elements: a time encoder 102; a pulse-domain demultiplexer 104; a pulse to asynchronous digital converter 106; an asynchronous digital to synchronous digital converter 108; a digital signal processor 110; and a timing reference circuit 112.

The time encoder 102 converts analog input data 101 into pulse data at its output. A pulse domain demultiplexer 104 has one input data channel and multiple (128 in this embodiment) parallel output data channels 105 which contain time interleaved asynchronous pulses representative of the analog input data 101.

A pulse to asynchronous digital converter 106 digitizes data in each of the parallel data channels from the pulse domain demultiplexer 104 into, in this embodiment, 12-bit words in each of the 128 channels. An asynchronous digital to synchronous digital converter 108 converts asynchronous digital data from the asynchronous digital converter 106 into synchronous digital data, preferably comprising 128 12-bit words in this embodiment.

The timing reference circuit 112 provides one absolute timing reference for every set of 128 time transitions.

The Digital Signal Processor (DSP) is used to do numerical computations on digital data. It can perform a numerical reconstruction of the original analog signal 101 using the algorithm provided A. Lazar and L. Toth, as previously mentioned, in "Perfect Recovery and Sensitivity Analysis of Time Encoded Bandlimited Signals," IEEE Trans. on Circuits and Systems—I, vol. 51, no. 10, pp. 2060-2073, October 2004, the disclosure of which is hereby incorporated herein by reference. This numerical reconstruction allows the data to be converted into a conventional format, for example, analog or conventional digital (with each digital value representing the value of the analog signal at regularly spaced sample points). The reconstruction to analog or conventional digital can be performed by other algorithms or methods besides that of Lasar and Toth mentioned above. For example, a reconstruction algorithm consisting of pulse filtering of the pulse sequence can be implemented as a pure hardware or software.

The bottom of FIG. 1 summarizes the main types of signals that are used in the architecture. It also shows a typical example of the number of channels and data rate for all signals. Five types of signals are used between the main blocks. These signals are as follows:

Conventional analog input signal 101 is continuous in time and continuous in amplitude. Continuous in time means here that the signal is not quantized in time. Continuous in amplitude means that the signal is not quantized in amplitude. There is a continuum of possible amplitudes that can occur. This analog signal 101 is used at the input of the architecture. In our example this input signal has an ultra wide bandwidth of preferably 10 GHz. The signal can be modulated using any convenient modulation type so long as the bandwidth is limited to a preferred value of 10 GHz.

Time encoded signal 103 is continuous in time and binary in amplitude. The information in this signal is encoded in the times of positive and negative pulse transitions of this signal. This information should not be not quantized, and thus it is the time between pulse transitions that defines the data as opposed to amplitude of the signals. The average pulse frequency of this signal needs to be only slightly over the bandwidth of the ADC analog input. In this embodiment the average pulse frequency is preferably $f_p$=12.8 GHz.

Time interleaved asynchronous pulses 105 are signals which are also continuous in time and binary in amplitude. In this embodiment there are 128 channels with these signals. The critical information of these signals is encoded in the duration of pulses, which in this embodiment are positive pulses. This information is not quantized. In this embodiment each channel operates at an average pulse rate of preferably $f_p$=200 MHz.

Asynchronous digital signals 107 contain information is quantized to a multi-bit resolution that is a 12 bit resolution in this embodiment but signal timing is asynchronous, meaning that the data itself is not quantized. In this embodiment the average rate is preferably $f_p$=200 MHz.

Synchronous digital signals 109 is a sampled version of the asynchronous digital signals 107. The sample rate in this embodiment is preferably 250 MHz. That is above the maximum rate of the parallel asynchronous signals.

Figure 2A:
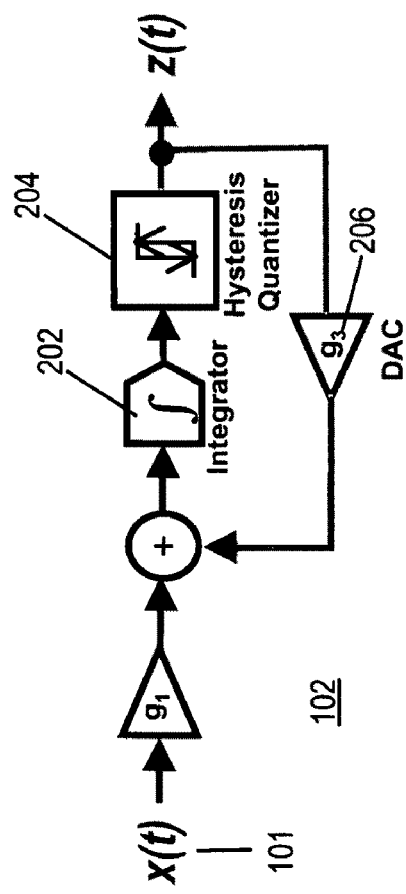
FIG. 2(a) shows a diagram of a prior art ideal time encoder circuit which may be used in the system of FIG. 1.

FIG. 2(a) shows a diagram of an ideal time encoder circuit 102. FIG. 2(b) shows a graph of the Output-Input characteristic of an ideal hysteresis quantizer 204. The ideal circuit of FIG. 2(a) has been used in prior art to do theoretical time encoding. See the previously mentioned article by Lazar and Toth. The article by Roza mentioned above discloses a CMOS implementation of this circuit which has also been used in the front end of a different serial ADC architecture for low bandwidth ADC applications (in the MHz range).

The time encoder circuit 102 preferably comprises a transconductance amplifier g1, an integrator 202, a hysteresis quantizer 204 and a 1bit feedback DAC 206. The hysteresis quantizer has only two possible output levels, $V_{OH}$ and $V_{OL}$. They are shown in the vertical axis of the graph of FIG. 2(b). The transition between the two output levels occur at two different input trigger voltage levels along the axis labeled $V_{in}$.

Figure 3A:
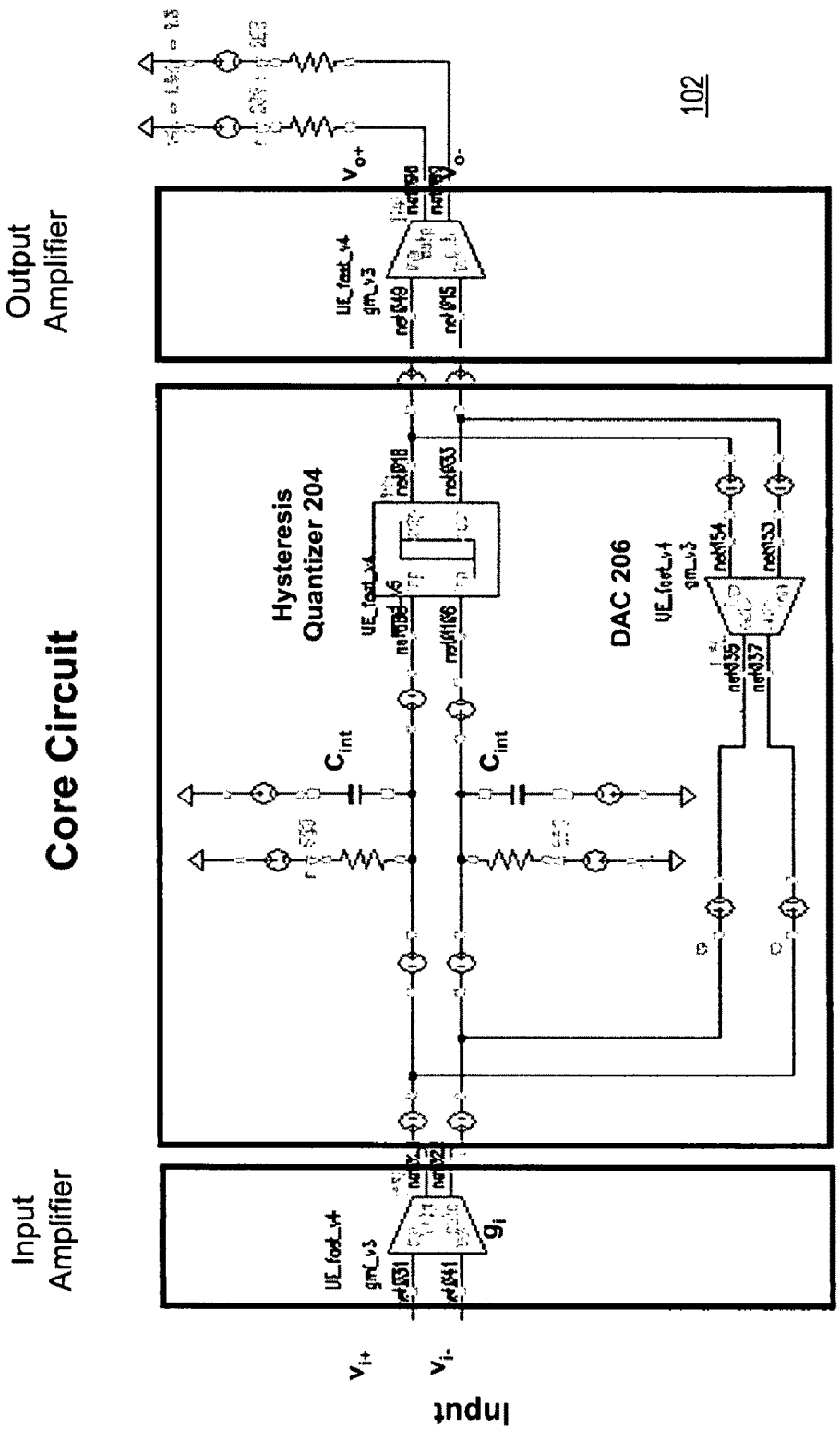
FIGS. 3(a)-3(c) show a preferred embodiment of the time encoder circuit of FIG. 2(a) implemented in a state of the art InP HBT integrated circuit technology.
Figure 3B:
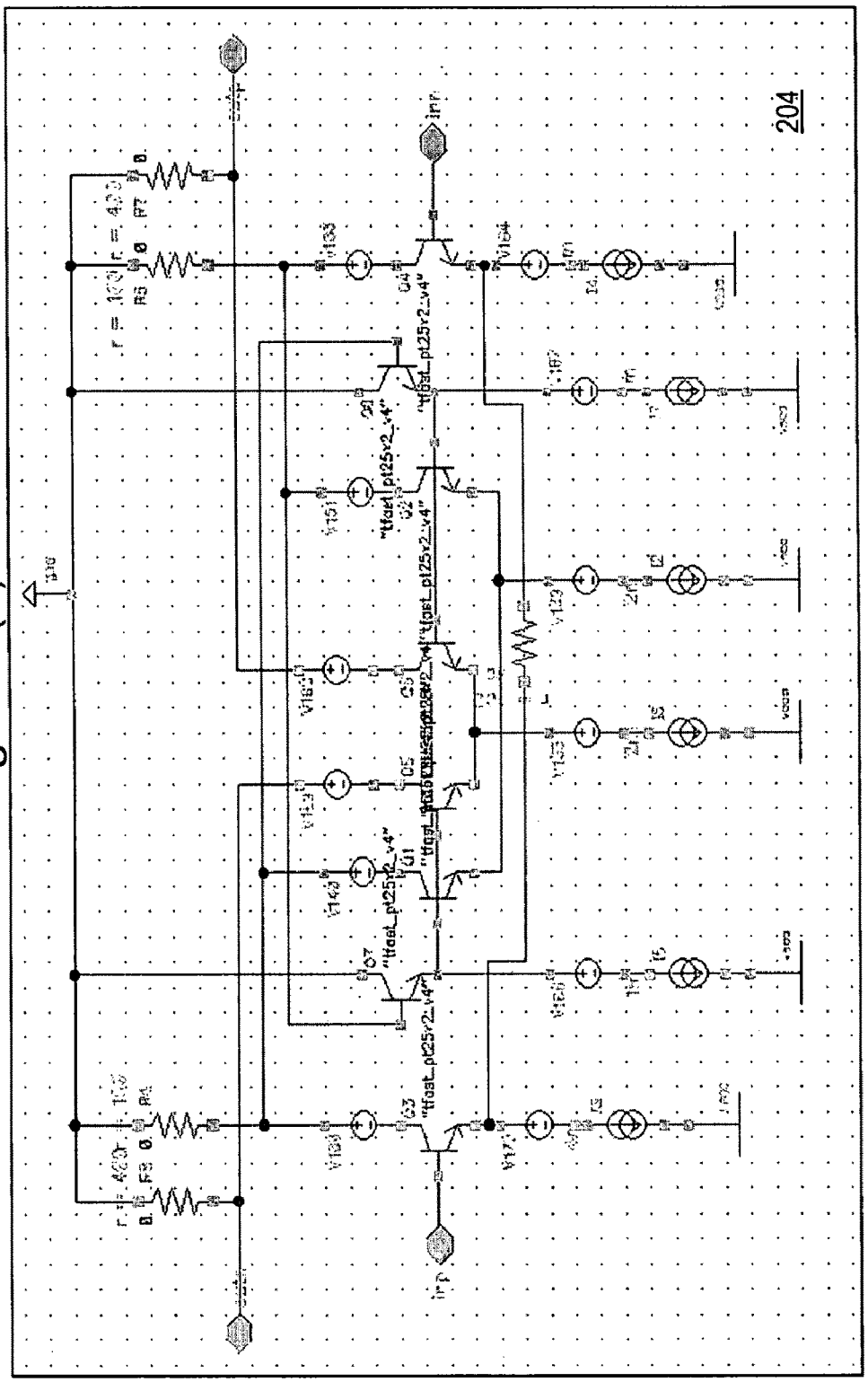
Figure 3C:
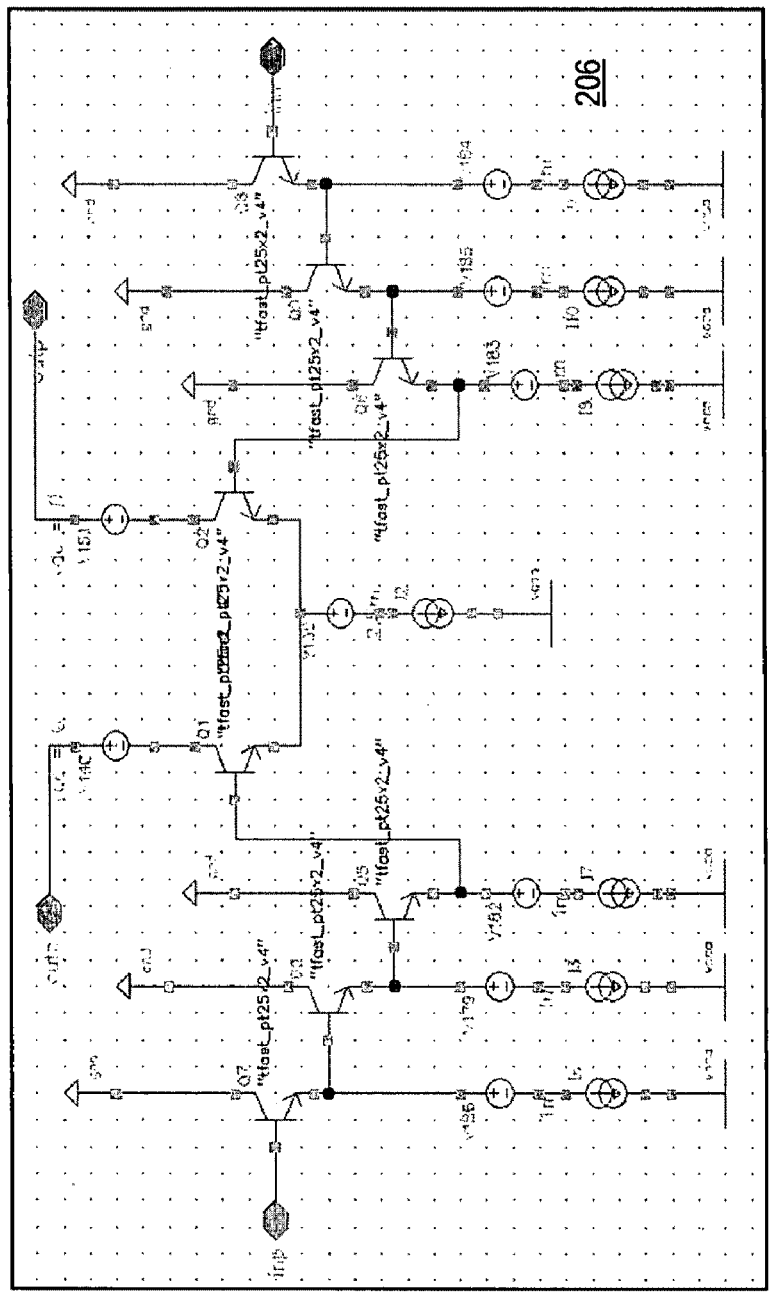

FIGS. 3(a)-3(c) show an embodiment of time encoder circuit 102 preferably implemented in a state of the art InP HBT integrated circuit technology. FIG. 3(a) shows the entire circuit 102. This circuit is fully differential. FIG. 3(b) shows the diagram of a differential-input differential-output embodiment of the hysteresis quantizer 204. This is a novel transistor circuit topology based on the use of three differential pairs, one of them with local positive feedback. FIG. 3(c) shows a schematic diagram of the 1 bit DAC 206.

Figures 4A, 4B, 4C:
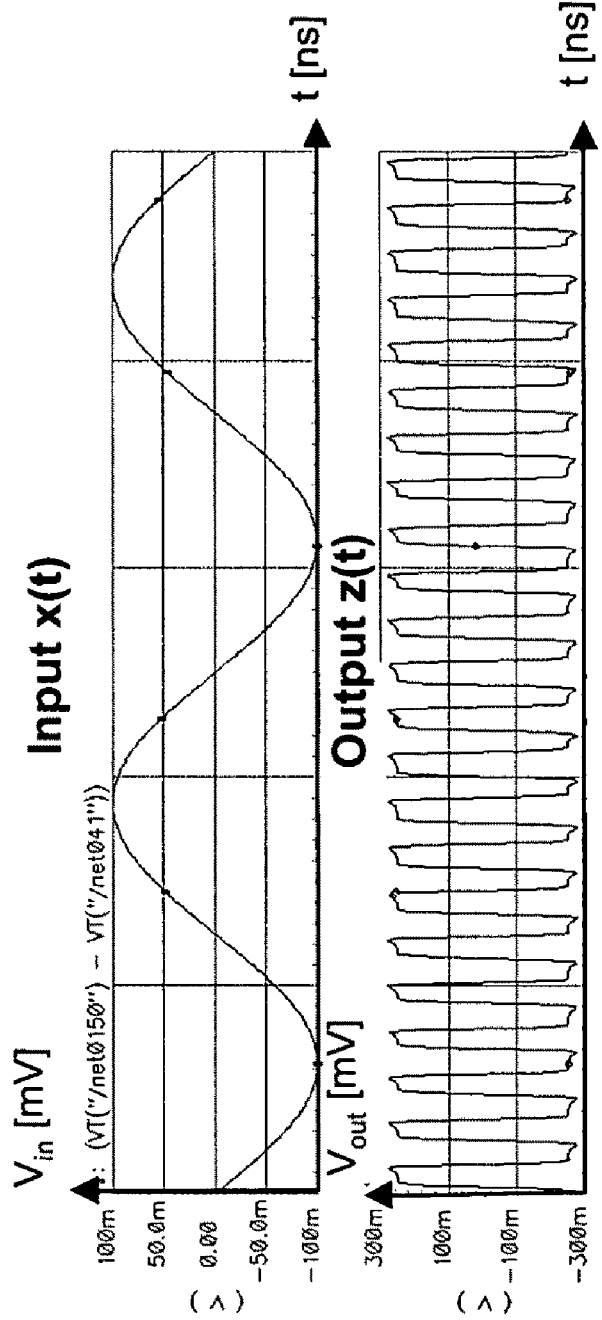
FIGS. 4(a)-4(c) are graphs showing an exemplary operation of the time encoder circuit 102 of FIGS. 3(a)-3(c).

FIGS. 4(a)-4(c) are graphs showing an exemplary operation of the time encoder circuit 102 of FIGS. 3(a)-3(c). FIG. 4(a) is a graph showing the analog input signal 101. In this particular example the input signal is 2 GHz sinusoidal signal. This signal corresponds to the difference of the voltages applied to each of the two terminals for the differential inputs $v_{i+}$ and $v_{i-}$ of the circuit of FIG. 3(a).

FIG. 4(b) is a graph is the output of the time encoder 102. The output signal is comprised of pulses. This signal appearing in the graph is the difference of the voltages $V_{o+}$ and $V_{o-}$ occurring at the two output terminals of the differential output of circuit 102. The timing of the pulses encodes the analog input information. The average pulse rate is set by the gain of the feedback DAC 206, the capacitor values, and the hysteresis trigger points. The pulse rate target for the time encoder 102 used in a preferred embodiment of the ADC architecture is 12.8 GHz (as is indicated on FIG. 1). However, even higher values can be easily achieved with the circuit of FIGS. 3(a)-3(c). FIG. 4(b) shows an embodiment when circuit is operating with a pulse rate as high as 23 GHz. FIG. 4(c) is a graph showing the recovered input signal. This is only shown to demonstrate the proper operation of this front-end circuit. For the purpose of generating the graph of FIG. 4(c) recovery is done by using a low pass to filter of the pulse signal of FIG. 4(c). This is just one recovery method that can provide reconstruction with good accuracy. The desired original signal is recovered. The only difference is a delay due mainly to the recovery filter. In the preferred embodiment ADC architecture 100 the recovery will be performed by the DSP 110 after data demultiplexing and digitization, so the recovery depicted here is mainly done as a test of the proper functioning of the circuit of FIGS. 3(a)-3(c). The actual ADC data recovery is not restricted to low pass filtering since 'exact' numerical recovery algorithms presented in the paper by A. Lazar and L. Toth can alternatively be used.

The ADC architecture 100 can be used to digitize an ultra wide bandwidth input signal 101 with high resolution. An example of specifications for our preferred embodiment of the ADC 100 is 10 GHz of bandwidth and ten effective bits. The time encoder circuit 102 is at the front of the architecture 100 and therefore should meet or exceed these ADC system specification. Simulations show that by using the InP circuit of FIGS. 3(a)-3(c) these system specifications should be exceeded in terms of both bandwidth and resolution. One of the critical limiting factors of the resolution is the SFDR (Spur Free Dynamic Range) of the circuit of FIGS. 3(a)-3(c). FIGS. 5(a) and 5(b) shows an example of SFDR simulation. This example corresponds to a one-tone test. The input signal is a sinusoid at 3.25 GHz. The FIG. 5(a) shows the reconstructed signal obtained by low pass filtering the pulse output of the time encoder 102 of FIGS. 3(a)-3(c). It is almost a perfect sinusoid. Distortion is measured via a FFT (Fast Fourier Transform) of the recovered data. FIG. 5(b) shows the FFT graph. The input original signal can be observed clearly at 3.25 GHz. In a 16 GHz bandwidth the highest spur is 94.4 dB below the main signal. This corresponds to 15.6 bits. This exceeds the ten effective bit specification of the preferred embodiment of the ADC architecture 100. Furthermore, this data is obtained when using a simple low pass recovery algorithm. Higher performance can be expected when performing other numerical reconstruction algorithms, such as the one presented in the paper by A. Lazar and L. Toth mentioned above, in the DSP 110.

These results show that the time encoder 103 of FIGS. 3(a)-3(c) can meet the specifications for the preferred embodiment of the overall ADC 100. Data with more than 10 GHz bandwidth can be encoded with more than 10 bit resolution in a pulse stream. The other blocks of the architecture 100 of FIG. 1 are used to digitize this output pulse stream.

FIG. 6 shows the diagram of a preferred embodiment of the pulse domain deMUX 104. In our preferred embodiment it is a 1:128 pulse deMUX.

This pulse domain deMUX circuit 104 is used to parallelize the pulse data prior to digitization. This is important because the rate that pulse data can be digitized is limited in speed for any given resolution and technology. This deMUX 104 allows reducing the rate at which data needs to be quantized and digitized in each channel. It enables us to obtain a higher bandwidth for the entire ADC system 100.

The deMUX circuit 104 is composed of two paths. One is the path 602 used for data. The other path is used for control 604. Both paths are driven by the input pulse signal 103. The data 103 ($v_p$) is fed, after being optionally buffered by buffers 606, into an array of AND gates 608. The control path 604 has a 1-to-128 counter 610. This counter has no clock. It increments its asynchronous output word 612 (which is seven bits wide in our preferred embodiment so that this binary counter can have 128 states corresponding to the 128 output channels $V_1$-$V_{128}$ from gates 608) when a pulse transition is detected at the input 103. The increment occurs for both positive and negative pulse transitions. After reaching a maximum value, which is 128 in our preferred embodiment, the next value is reset to 1 in counter 610. The output word 612 is denoted in FIG. 6 as "Asynchronous Timing Control", $t_c$. This control is used to drive a logic circuit 614 that produces control signals on a multi-bit bus 616, which in our preferred embodiment is a 128 bit bus 616, so there are 128 individual control signals on bus 616 in our preferred embodiment. The circuit is insensitive (up to a given threshold) to jitter and offsets in the timing of $t_c$ and the 128 control signals 614.

The array 608 is preferably comprised of AND gates (one hundred an twenty eight gates in the preferred embodiment). Each gate has two inputs: one driven from the data path 602 and the other by the control path 604. The inputs driven by the data path is inverted by an inverter 609 on every other gate. So one gate output produces a positive output (or positive data pulses) while the other output produces a negative output (or negative data pulses).

Figure 7:
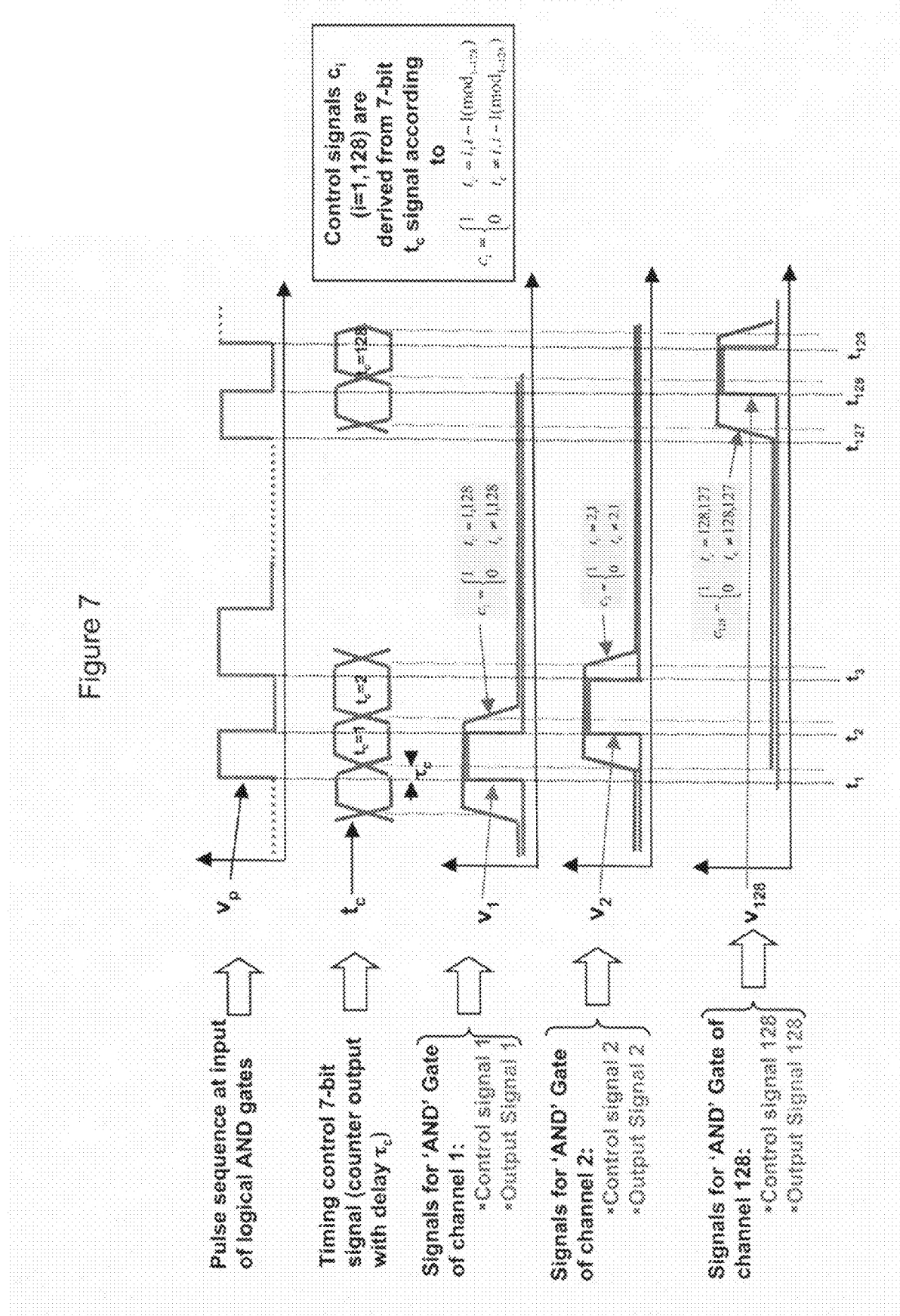
FIG. 7 is a graph showing a details of important waveforms for the preferred embodiment of the pulse deMUX circuit.

FIG. 7 is a graph showing a details of important waveforms for the preferred embodiment of the pulse deMUX circuit 104, which in the preferred embodiment is a 1:128 deMUX. The top waveform of FIG. 7 shows the serial pulse waveform, $v_p$, just before being fed into the 128 'AND' logical asynchronous gates of array 608.

The second waveform of FIG. 7 shows the timing control signal $t_c$. It is assumed that the counter output 610 has a fixed positive delay, τc, to respect to the edges of the signal $v_p$. This happens if the counter in the control path 604 has a larger delay than the buffering in the data path 602. The delay, τc, could be zero or negative depending on the amount of relative delay between the control and data paths.

The third waveform shows two superimposed waveforms of the control and output signal for channel 1. The control signal is shown as a dashed line (originally blue). The control signal positive pulses are longer in duration than corresponding pulses in the $t_c$ signal immediately above it in FIG. 7. In particular, it has the duration of two pulses of the signal $T_c$. The control pulse is longer and fully encloses a positive pulse of the signal $v_p$ shown in the top graph of FIG. 7. The control signal is enabled during two consecutive output values of the counter (values 1 and 128). This control signal can be used to select the first positive pulse in a group of 128 pulse intervals of the signal $v_p$ via a logical 'AND' operation. The output signal is shown in a solid line (gray in the original). The desired pulse of the signal $v_p$ is selected. The edges (positive and negative) of the output are determined by the edges of the data signal $v_p$. The rise transitions in the control signal occur before the transition in the desired pulse of the data signal $v_p$. The fall transition in the control signal occurs after the gate transition in the desired pulse of the data signal $v_p$. Both transitions occur when the data signal $v_p$ is constant at logical level 0, in this embodiment. Small shifts in these control transitions of $t_c$ have no effect in the edges of the final selected output.

The effect each of the gates 608 is to select an asynchronous pulse out of the pulse train $v_p$ and apply is to a separate output of the pulse domain deMUX 104.

The fourth waveform down from the top of FIG. 7 shows two superimposed waveforms of the control and output signals for channel 2. The control signal is also enabled during two consecutive output values of the counter (now for values 1 and 2). This is done by logic circuit 614. This circuit 614 is a combinatorial logical circuit with a 7-bit input that contains the state of the counter and has 128 binary outputs, one for each channel. The second output is enabled only when the counter is at the values of 1 and 2 and is disabled for all other values of the counter. This combinatorial circuit 614 can be built using standard logic gates without a need for a clock signal. The control signal (see the dashed line) is used to select the first negative pulse of the signal $v_p$ of a group of 128 pulse intervals. This is via a logical 'AND' with the data input inverted. The output signal is shown in a solid line (gray in the original). This output is enabled during the duration of the first negative pulse of the signal data $v_p$.

All other channels of the pulse domain deMUX 104 operate in similar way. In the preferred embodiment, the 128 channels, $v_1$-$v_{128}$, contain the information of 128 consecutive pulse intervals (64 positive pulses and 64 negative pulses) of the signal $v_p$. In our preferred embodiment input signal operates at a rate of ~12.8 GHz. This input signal is time encoded as already described. Information is encoded into both the positive and the negative time intervals of signal 103. The signal 103 contains an average of 25.6 Giga Time-Intervals per second in this preferred embodiment. Each of the 128 output channels in this preferred embodiment produces an average of 200 pulses per second (200 MHz). The bottom graph of FIG. 7 shows two superimposed waveforms of the control and output signals for channel 128, and the significance of these two superimposed waveforms should now be readily apparent to those skilled in the art based on the explanation given above.

FIGS. 8(*a*) and 8(*b*) show diagrams of the next component of the architecture 100. This component is the pulse to asynchronous digital converter 106. FIG. 8(*a*) shows a diagram of the entire Pulse to Asynchronous Digital Converter circuit 106. The circuit is fully asynchronous. It does not require any external clock. Its function is to convert the time interleaved asynchronous pulses 105 output from the asynchronous pulse domain deMUX 104 into digital asynchronous signals.

The pulse to asynchronous digital converter circuit 106 of FIG. 8(*a*) has a input data channel 801 which has the same number of channels as are in the input signal 105, so in the preferred embodiment, that means that input data channel 801 has 128 channels. The pulse to asynchronous digital converter circuit 106 of FIG. 8(*a*) also receives the asynchronous control signal $t_c$ generated by counter 610, which in our preferred embodiment comprises a seven bit signal. The pulse to asynchronous digital converter circuit 106 of FIG. 8(*a*) produces a parallel data output 107 of 128 channels in our preferred embodiment. Each output channel 107 produces an asynchronous digital word of preferably twelve bits in this embodiment. Each of the 128 channels preferably has a 1 bit DAC 802, an integrator 804 with a reset control input, and an asynchronous analog-to-digital converter 806, shown in greater detail in FIG. 8(*c*). The pulse to asynchronous digital converter circuit 106 of FIG. 8(*a*) has a control circuit having, in our preferred embodiment, a 7-input 128-output combinatorial logic circuit.

The array of 1 bit DACs 802 regenerate any amplitude level attenuation which may have occurred in the input signals. Therefore, the inclusion of these optional 1 bit DACs 802 make circuit 106 tolerant to changes in the amplitude value of the signals 106 from the pulse domain deMUX 104. Only the timing of the pulses in signals 106 is significant, not their amplitudes. But if any following circuitry is amplitude sensitive, then including these 1 bit DACs 802 will serve to remove what otherwise would be a source of noise.

For each time interleaved asynchronous pulse 106, only the time duration of the pulse is relevant and not the exact timing of its rise and fall edges. This is because only the integral value of the pulse is computed for each channel. The circuit is tolerant to constant timing offsets (time skews) in the incoming interleaved pulse data. Furthermore, the circuit can tolerate without information loss different time offsets for each channel. But since an integral will be computed, removing amplitude variation in signals 106 using the array of 1 bit DACs 802 makes good sense.

The control signal for each channel is generated from the asynchronous timing control data (output of the counter 610), $t_c$ by logic 808. Logic 808 is similar to logic 614 described with reference to FIG. 6 for the deMUX 106, but logic 808 has the following differences: (i) the control signal 810 of each channel is enabled for just only one value of $t_c$ (not two consecutive values as done by logic 614) and (ii) the control signal 810 is enabled before the target pulse from the DACs 802 (not during the pulse as done by logic 614). The control signals 810 generated by logic 808 are used to reset each integrator 804 about 126 counter intervals (in our preferred embodiment) after the last pulse arrival, or equivalently about two counter intervals before a next pulse arrival. That is, the control 810 for channel i enables when the counter 610 is at value i−2, with the values being module 1-to-128. So, for example:

Control of channel 1 is enabled when counter is equal to value 127.

Control of channel 2 is enabled when counter is equal to value 128.

Control of channel 3 is enabled when counter is equal to value 1.

. . .

Control of channel 128 is enabled when counter is equal to value 126.

FIG. 8(*b*) shows waveforms at channel i. The top waveform is the pulse data. A pulse arrives on average every 5 ns (equivalent to a rate of 200 MHz) in our preferred embodiment. The duration of a single pulse, or counter value time interval, is much shorter. On average, the duration of a pulse is just $5*(1/128)$ ns with a relatively long interval of $5*(127/128)$ ns with no pulse in this preferred embodiment. The bottom waveform of FIG. 8(*b*) depicts the output of the integrator 804$_i$ of channel i. This output is reset about two counter intervals before the pulse arrival, as discussed above. The pulse is integrated by the integrator 804$_i$ and the integrated value or result is preferably held at the integrator's output until the next reset. For most of the aforementioned 5 ns interval, the output of the integrator 804$_i$ is at a constant value that corresponds to the integral of the pulse output from the associated 1 bit DAC 802 for channel i. In each channel the asynchronous ADC 806 has most of the 5 ns interval available to settle. So the data to be digitized for each channel i is essentially a constant value output by its associated integrator 804$_i$.

The speed requirements on each individual asynchronous ADC 806 (200 MHz settling time for digitizing a constant input) are much lower than the specifications of the entire ADC system 100 (digitization of a varying input signal 101 having a 10 GHz bandwidth). This is an important feature of the invention. It allows us to achieve high architecture performance by using an array of moderate performance asynchronous ADCs 806. FIG. 8(*c*) shows an embodiment of a possible implementation of such an ADC 806 using 12 bit DACs. This particular ADC 806 is known, per se, in the prior art (see A. Dighe, "*An Asynchronous Serial Flash Converter*" *9th Int. Conf on Electronics, Circuits and Systems*", 2002). Other ADCs designs could alternatively be used. Each ADC 806 preferably produces a 12-bit word. This is about a two bit extra margin over the 10 bit effective resolution desired for the preferred embodiment of the entire system 100.

Figure 9:
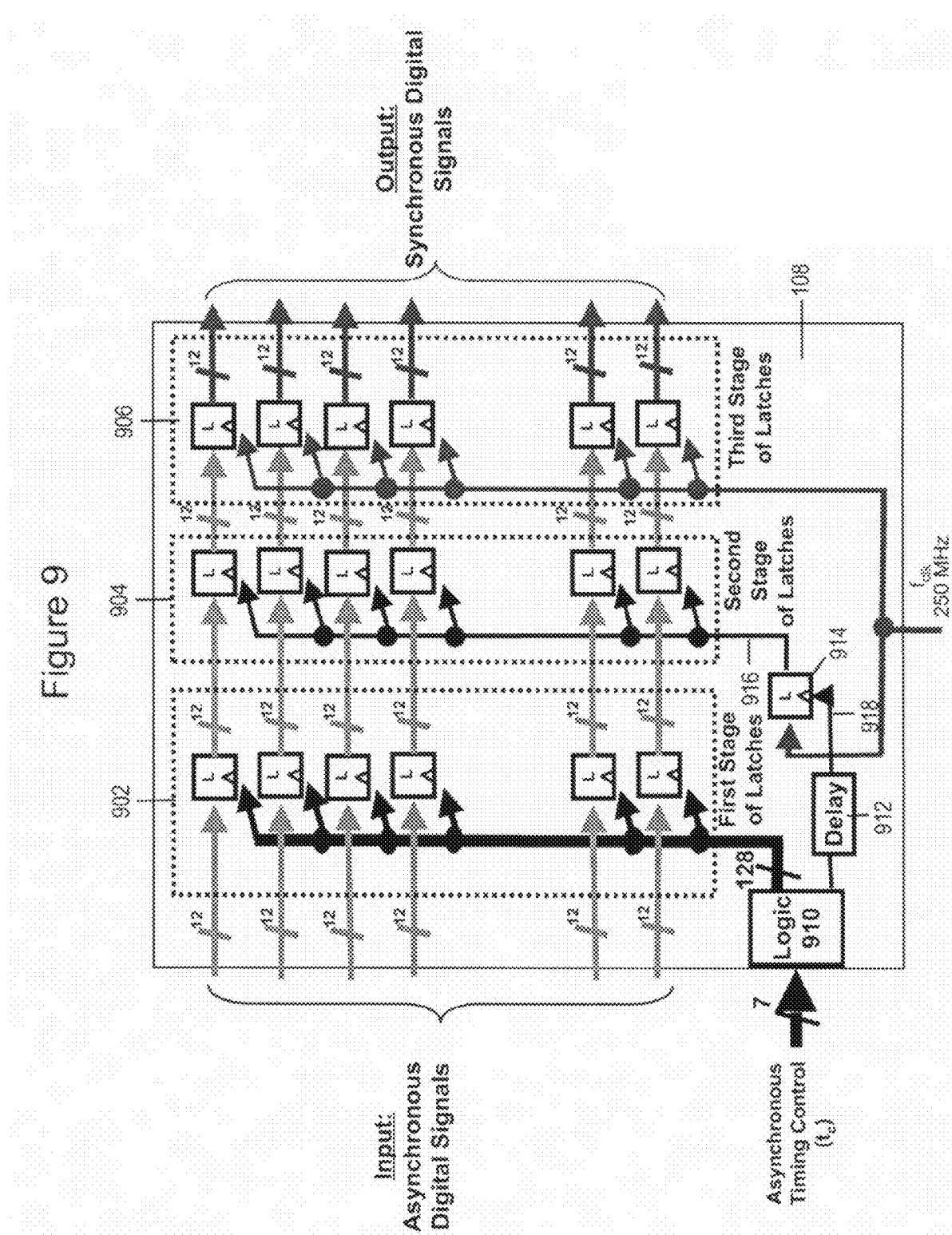
FIG. 9 shows the schematic diagram of a preferred embodiment of the asynchronous digital to synchronous digital converter of FIG. 1.

FIG. 9 shows the diagram of the a preferred implementation of the fourth component of the architecture 100 of FIG. 1. This component is the asynchronous digital to synchronous digital converter 108. This is the first block of the architecture 100 to require a clock ($f_{clk}$).

The asynchronous digital to synchronous digital converter 108 receives the 128 12-bit asynchronous words 107 provided by the preferred embodiment of the converter 106 as data. It also receives a control input, $t_c$, from the counter 610 of the deMUX circuit of FIG. 6, and an external clock reference $f_{clk}$. It produces 128 12-bit words synchronized to the clock as output data.

The preferred embodiment of the asynchronous digital to synchronous digital converter 108 of FIG. 9 preferably has 128 channels and three stages. Each of the 128 channels is preferably composed of three latches 902, 904 and 906. The first latch 902 stage of each channel captures the digital asynchronous data 107 when an internal control signal on bus 908 has a rising edge. There are 128 of these control signals, one for each channel, in bus 908.

The control signal for the first latch 902 of each channel is generated by the logic 910 using the asynchronous timing control, tc, generated by counter 610. For each channel the control signal on bus 908 rises when the preceding asynchronous ADC in the previous block (the Pulse to Asynchronous Digital Converter of FIG. 8(*a*)) has used most of the settling period previously discussed with reference to FIG. 8(*a*). That happens at end of the holding period shown in the bottom waveform of FIG. 8(*b*) just before the reset signal on bus 810 of that particular channel is enabled. In the preferred embodiment the control signal rises one pulse interval (about 5·(1/128) ns) before the reset signal shown in the bottom graph of FIG. 8(*b*). The control for channel i enables (rises) when the counter is at value i−3, with the values being modulo 1-to-128. In particular:

Control of channel 1 is enabled when counter is equal to value 126.
Control of channel 2 is enabled when counter is equal to value 127.
...
Control of channel 128 is enabled when counter is equal to value 125.

The data at the output is the first stage of latches 902 contains the digitized values of 128 pulses as integrated by the ADCs 806 shown in FIG. 8(*a*). In each channel the data at the output of each latch is updated on average every ~5 ns (~200 MHz). The data is valid during the entire ~5 ns interval. This data is captured by the next stages of latches 904 and 906 that operate at a higher rate, and preferably a 250 MHz rate in this embodiment, which rate is controlled by a synchronous clock $f_{clk}$. This higher synchronous rate is chosen to be at least as large as the maximum rate of the non-constant asynchronous rate of system 100. In this way, the clocked latch stages are guarantee to capture at lest one sample for each asynchronous cycle. For some asynchronous cycles a second redundant sample may be captured that is later disregarded by the DSP. In terms of the preferred embodiment, the 250 MHz rate controlled by clock $f_{clk}$ is higher than the ~200 MHz rate $f_p$ of the system 100.

In the preferred embodiment, the second stage of latches 904 operates at an average rate of 250 MHz. In this stage all 128 latches share a single control signal on control line 916 that is generated by an auxiliary latch 914. The rise of this control signal on line 916 determines the capture instant. This control signal rises once for each synchronous 250 MHz cycle. The exact rising instant is shortly after the rise of the synchronous clock $f_{clk}$, and controlled by a secondary fast-changing asynchronous signal on line 918 (one transition for each $t_c$ transition) at the output of the logic 910, but delayed by delay block 912. This secondary asynchronous control signal on line 918 rises at times when no control signal 908 of the first stage of latches 902 is rising. This guarantees that the second stage of latches 904 capture data at an instant when none of the data outputs of the first latch stage 902 is changing value. The third stage of latches 906 receives date from the second stage of latches 904 and is controlled directly by the external 250 MHz clock. Output data 109 is sent to the DSP 110.

Figure 10A:
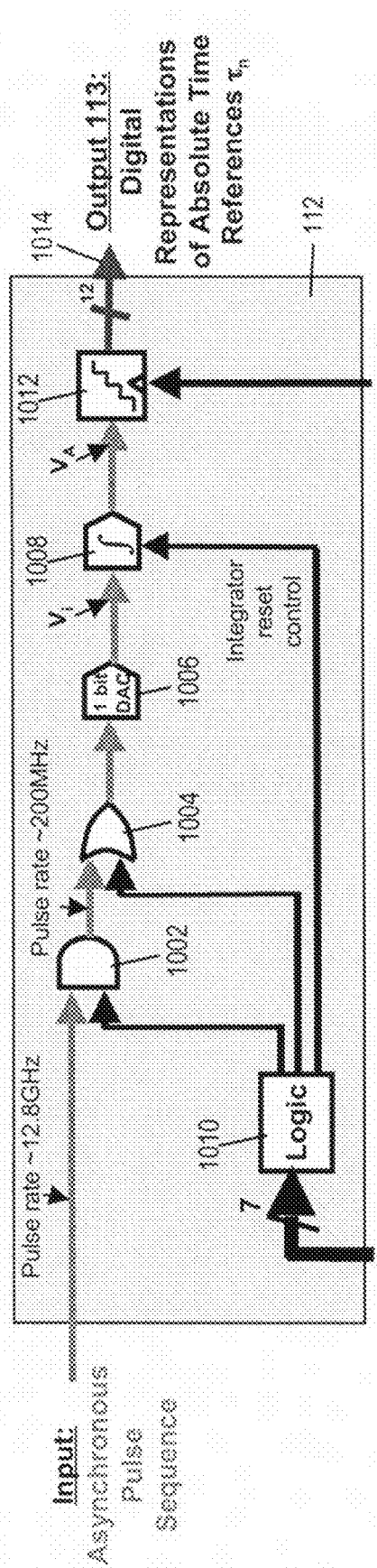
FIG. 10(a) shows a preferred embodiment an optional timing reference circuit which may be used with the system shown in FIG. 1.
Figure 10B:
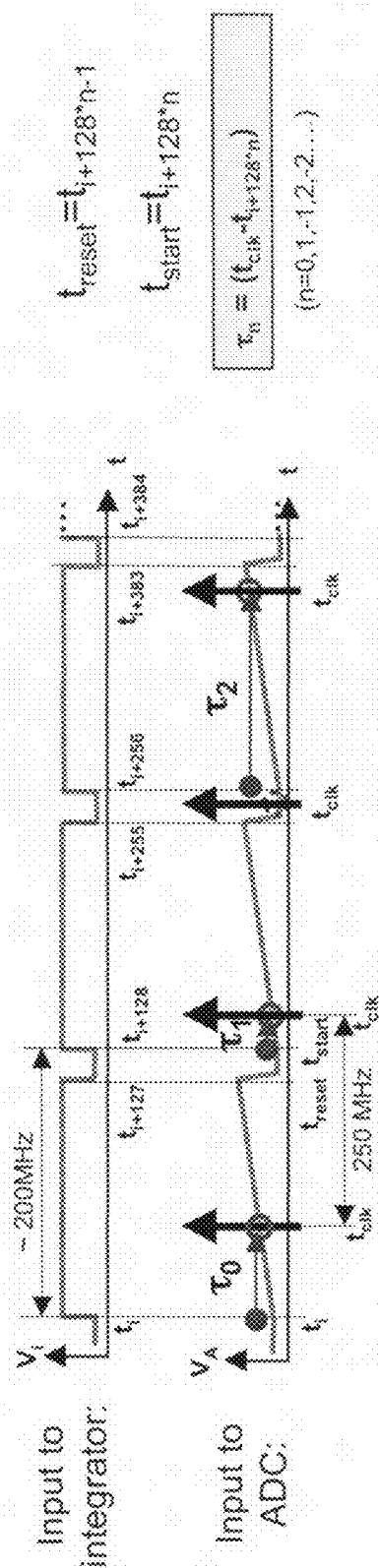
FIG. 10(b) includes two graphs: the top graph of FIG. 10(b) shows the output signal $V_i$ of a DAC while the bottom graph shows the waveform at the output of an integrator shown on FIG. 10(a).

FIG. 10(*a*) shows a preferred embodiment of another block of the architecture 100 depicted in block diagram form by FIG. 1. This block is a timing reference circuit 112 which provides a digital representation 113 of the absolute time values of every 128th pulse transitions of the asynchronous pulse sequence in its output 1014. This circuit 112 is used to avoid drift and to correct relative timing (pulse duration measurements) data from other stages. The output 1014 of this circuit 112 is connected directly to the DSP 110. All the corrections using the absolute timing data are done in the digital domain.

This stage has an input AND gate 1002 having two inputs: the asynchronous pulse sequence $v_p$ (signal 115) from the asynchronous pulse domain DeMUX 104 of FIG. 6 and a control signal from logic 1010. The operation of this gate 1002 is similar to the prior description for the operation of AND gate 806 in the top channel (channel 1) of the deMUX 106 of FIG. 8 (*a*). The control signal is the same as control signal $c_1$ of FIGS. 6 and 7. This control signal is enabled when the counter value $t_c$ is equal to 128 or 1. The output of AND gate 1002 selects a positive pulse of the asynchronous pulse sequence. This pulse is selected once every 128 edges in the original asynchronous pulse sequence. As such the control signal for AND gate 1002 could correspond to any one of the control signals $c_1 \ldots c_{128}$ of FIGS. 6 and 7, it being understood that the foregoing range of subscripts just reflect the possible number of counts in counter 610, which has been selected to be equal to 128 in our preferred embodiment of our invention.

The output of AND gate 1002 is coupled to an input of an OR gate 1004 which is used to stretch the falling edge of the pulse function for the most of the counter cycles of counter 610. Preferably, the stretch is done for all but two of those cycles, so in the context of the preferred embodiment disclosed herein, the stretch is for the next 126 counter ($t_c$) cycles. This is done by using a control signal on line 1003 that is enabled for all counter values except when the counter value is 127 in this preferred embodiment. Of course, if the control signal selected for AND gate 1002 is other $c_1$ of if the counter 610 counts to other values, then the control signal on line 1003 must be changed accordingly. The output of the OR gate 1004 drives a 1-bit DAC 1006 with current output.

FIG. 10(*b*) includes two graphs. The top graph of FIG. 10(*b*) shows the DAC 1006 output signal $V_i$. The important information of this signal occurs in the rise timing of its pulse. The rise timing corresponds to one edge out of every 128 edges of the original asynchronous pulse sequence. This rise timing is not affected by jitter and offsets (up to a given threshold) in any of the control signals.

This DAC 1004 basically performs a similar function to that of the DACs $804_1 \ldots 804_{128}$ of FIG. 8(*a*). Since, this DAC 1004 drives an integrator stage 1008, the DAC 1004 reduces noise which might otherwise arise in the integrator 1006 dues to amplitude variation of the pulses. The bottom graph of FIG. 10(*b*) shows the waveform at the output of the integrator 1008. The integrator 1008 is reset by a control signal that is enabled when the counter $t_c$ is at value 127 in this embodiment. The pulse signal inputed into the DAC 1006 is integrated as a linear ramp. This ramp start at times $t_{i+128*n}$ (where n is an integer). The output of integrator 1006 is fed into a synchronous ADC 1012. At times $t_{clk}$, the voltage in the ramp is proportional to $\tau_n = t_{clk} - t_{i+128*n}$. The digitized output of the clocked ADC is a digital representation of $\tau_n = t_{clk} - t_{i+128*n}$. This is used by the DSP 110 to obtain an absolute reference of the timing every 128 edge transitions. This redundant information is used to correct for drifts in the pulse duration data provided by the other blocks shown in FIG. 1. So while the circuitry of FIG. 10(*a*) can well be considered to be optional, it is also very useful in the context of the system disclosed herein as it contributes to reducing drift which those skilled in the art realize is undesirable.

The sampling frequency $f_{clk}$, for the DAC 1012 is higher than the maximum frequency of the asynchronous pulse signals, which in the preferred embodiment is ~200 MHz in average and thus, as before $f_{clk}$ is selected to be 250 MHz in this embodiment as shown in FIG. 10. This guarantees that every ramp is sampled at least once (and occasionally twice). Output data is sent to the DSP 110. Occasional samples not coinciding with a ramp can be identified and disregarded by the DSP 110.

Behavioral simulation results and evaluation of two key sub-circuits will now be discussed. In particular: (1) Behavioral simulations of the circuit of FIG. 6 (Pulse DeMUX); (2) Behavioral simulation of the circuit of FIG. 8 (Pulse to Asynchronous Digital Converter and (3) Reconstruction from asynchronous digital output. Evaluation via FFT.

Figure 11:
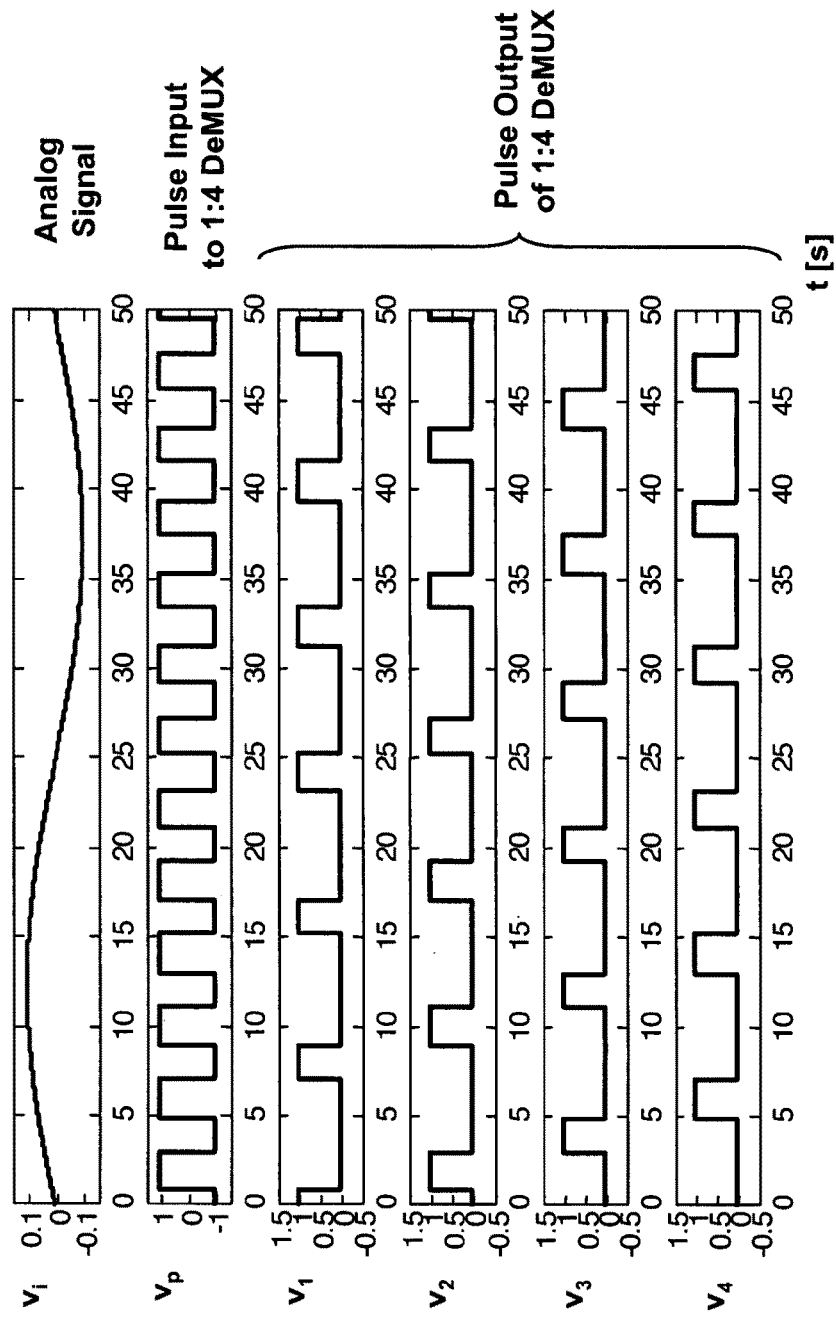
FIG. 11 shows simulation results of the deMUX of FIG. 6.

FIG. 11 shows simulation results of the DeMUX 104 of FIG. 6 assuming four channels. The top graph of FIG. 11 shows the original analog data, $v_i$. In this example it corresponds to a 0.02 Hz sinusoid with 0.1 v amplitude. The second graph shows the encoded data, $v_p$. In this simulation we use an ideal time encoder with all values (input gain, feedback gain, quantizer thresholds and quantizer outputs) normalized to one. Each half-period (positive pulse or negative pulse) is approximately 2 seconds. This half-period is not constant. The next four signals are the outputs of the DeMUX of FIG. 6. The outputs $v_1$ and $v_3$ are enabled during the duration of every second negative pulse of $v_p$. The outputs $v_2$ and $v_4$ are enabled during the duration of every second positive pulse of $v_p$. Each of these outputs operate at an average rate of $1/((2*4)$ seconds)) or 0.125 Hz. This rate is not constant. This rate is slower than in the original $v_p$.

Figure 12:
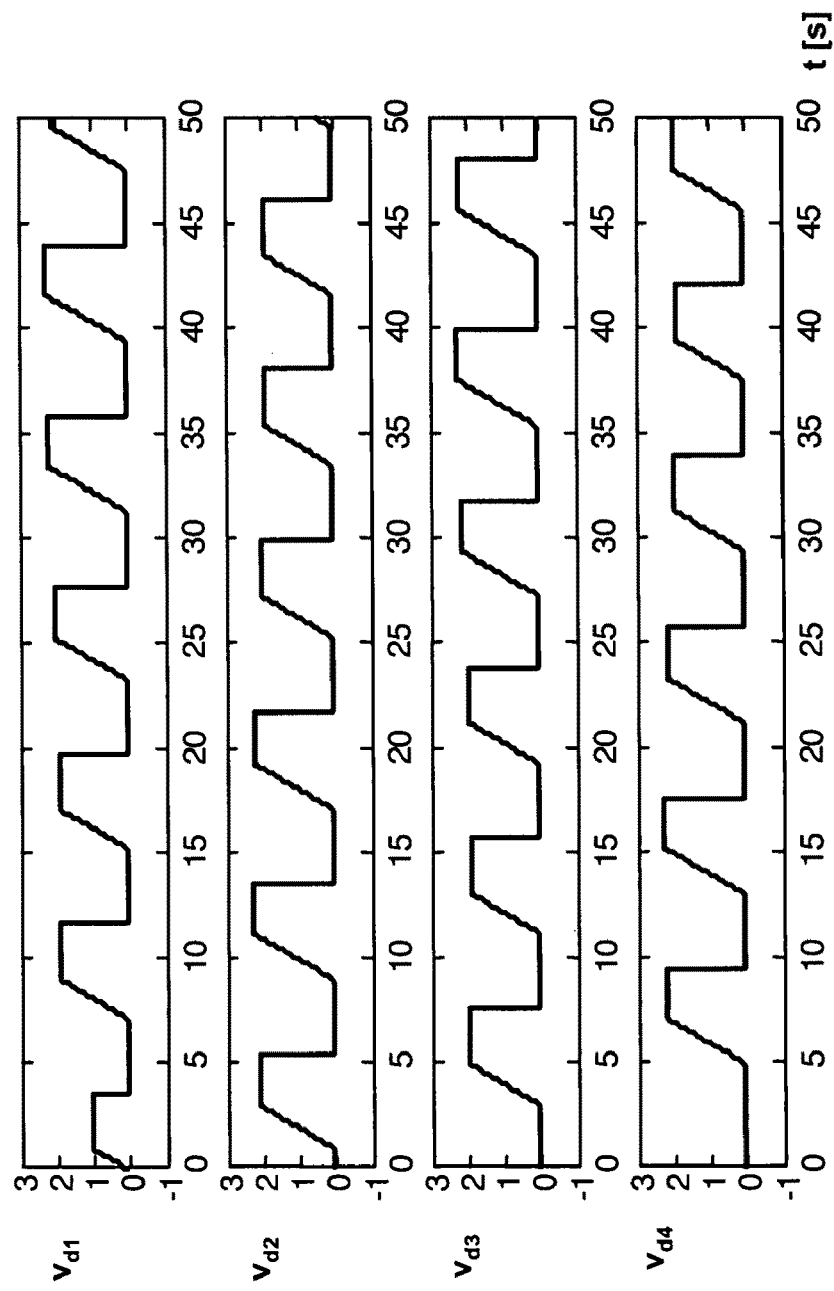
FIG. 12 shows a behavioral simulation of the pulse to asynchronous digital converter 106 of FIG. 8(a).

FIG. 12 shows a behavioral simulation of the pulse to asynchronous digital converter 106 of FIG. 8(*a*). The simulated pulse to asynchronous digital converter 106 used four internal asynchronous ADCs for the purpose of the simulation as opposed to the 128 suggested for the preferred embodiment, in order to conserve the amount of processing power needed to run the simulation. Each ADC needs to operate only at the lower rate of each one of the output channels of DeMUX 104. The top signal $v_{d1}$ is the 12-bit output of the first channel of the pulse to asynchronous digital converter 106. This signal is preferably composed of a zero-value, a linear slope, and a positive hold value. The positive hold value encodes the duration of one of every four pulses in the original time encoded sequence. The other signals encode the duration of the other interleaved pulses.

Figure 13:
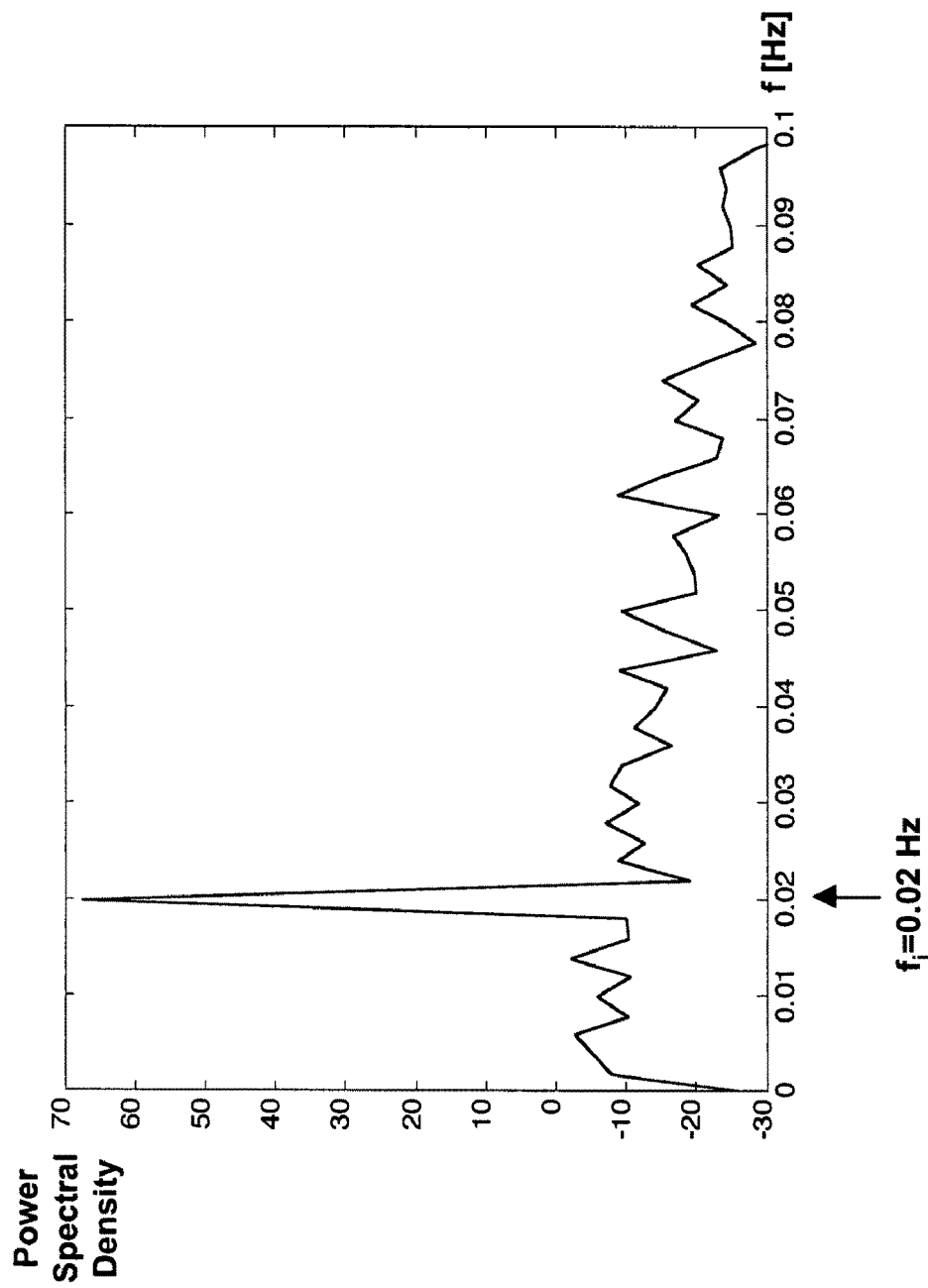
FIG. 13 shows a FFT (Fast Fourier Transform) of reconstructed signal using the data of FIG. 12.

From the data of FIG. 12 we have done a reconstruction of the original signal. A sinusoid at 0.02 Hz is obtained, as expected. FIG. 13 shows a FFT (Fast Fourier Transform) of reconstructed signal using the data of FIG. 12 during a duration of 500 seconds. An SFDR exceeding 70 dB is observed in this simulation.

Having described the invention in connection with a preferred embodiment and/or embodiment, modification will now suggest itself to those skilled in the art. the invention is not to be limited to the disclosed embodiments except as specifically required by the appended

What is claimed is:

1. An analog to digital converter comprising:
   (i) a time encoder for converting an input analog signal into a serial asynchronous pulse domain data stream;
   (ii) a pulse domain demultiplexer for converting the serial asynchronous pulse domain data stream into a time-interleaved, parallel bit data stream;
   (iii) a pulse to asynchronous digital converter for converting the time-interleaved, parallel bit data stream into multi-bit asynchronous digital words of data; and
   (iv) an asynchronous digital to synchronous digital converter for converting multi-bit asynchronous digital words of data into synchronous digital signals.

2. The analog to digital converter of claim 1 further including a digital signal processor coupled to receive the synchronous digital signals, the digital signal processor removing redundant data representing pulses in the serial asynchronous pulse domain data stream which may have been converted more than once into the time-interleaved, parallel bit data stream.

3. The analog to digital converter of claim 2 further including a timing reference circuit for avoiding drift and to correct, in the digital signal processor, relative timing errors occurring in the pulse domain elsewhere in the analog to digital converter.

4. The analog to digital converter of claim 3 wherein the pulse domain demultiplexer includes an asynchronous multi-bit counter, the pulse domain demultiplexer having a number of channels, the number of channels equalling a number of counting states of said asynchronous multi-bit counter, the state of the asynchronous multi-bit counter being provided as a control signal to said timing reference circuit.

5. The analog to digital converter of claim 1 wherein the time encoder comprises:
   a transconductance amplifier having differential outputs;
   a passive differential filter coupled to the differential outputs of the transconductance amplifier;
   a differential hysteresis quantizer coupled to the passive differential filter; and
   a differential 1-bit feedback DAC having differential inputs coupled to the differential hysteresis quantizer and having differential outputs coupled to the passive differential filter.

6. A pulse domain demultiplexer receiving a pulse domain signal, the pulse domain demultiplexer comprising:
   a control stage connected to an input of the demultiplexer, the control stage comprising:
   (i) a counter with a single input, no clock input and a multi-bit asynchronous output, the counter incrementing when it detects an edge in an inputted pulse sequence at said single input; and
   (ii) a logic block connected to an output of the counter and implementing asynchronous Boolean operations; and
   a deMUX logic switch block comprising:
   (i) an array of logical 'AND' gates, each gate having two inputs, a first input receiving the pulse sequence and a second input receiving a control signal from logic block, wherein outputs of the 'AND' gates provide time interleaved asynchronous pulses at a lower frequency than the pulse signal received by the pulse domain demultiplexer.

7. The pulse domain demultiplexer of claim 6 further including a buffering stage connected between the input of the demultiplexer and the control stage.

8. The pulse domain demultiplexer of claim 6 wherein said pulse domain signal provides said inputted pulse sequence.

9. A Pulse to Asynchronous Digital Converter (ADC) comprising:
    a logic block connected to a counter output of a deMUX, the logic block implementing asynchronous Boolean operations based the output of said counter;
    an array of 1 bit DACs for receiving block data inputs;
    an array of integrators receiving inputs from the array of DACs and having a reset controlled by outputs of the logic block; and
    an array of asynchronous analog to digital converters, each digital converter having a resolution of the ADC, but operating at speed much lower than the bandwidth of the ADC.

10. A Pulse to Asynchronous Digital Converter (ADC) of claim 9 in combination with a pulse domain demultiplexer receiving a pulse domain signal, the pulse domain demultiplexer comprising:
    a control stage connected to an input of the demultiplexer, the control stage comprising:
        (i) a counter with a single input, no clock input and a multi-bit asynchronous output, the counter incrementing when it detects an edge in an inputted pulse sequence at said single input; and
        (ii) a logic block connected to an output of the counter and implementing asynchronous Boolean operations; and
    a deMUX logic switch block comprising: an array of logical 'AND' gates, each gate having two inputs, a first input receiving the pulse sequence and a second input receiving a control signal from logic block, wherein outputs of the 'AND' gates provide time interleaved asynchronous pulses at a lower frequency than the pulse signal received by the pulse domain demultiplexer,
    wherein an output of said counter provides said counter output to said logic block.

11. An Asynchronous Digital to Synchronous Digital Converter comprising:
    a logic block connected to a counter output, the logic block implementing asynchronous Boolean operations based the output of said counter;
    a first array of latches for receiving asynchronous block data inputs, a latch instantiation of said first array controlled by multiple outputs of the logic block;
    a second array of latches for receiving inputs from the first array of latches, a latch instantiation of said second array being controlled by a common signal generated by an external clock and a control output of the logic block; and
    a third array of latches for receiving inputs from the second array of latches, a latch instantiation of the third array being controlled by a common signal generated by an external clock and wherein outputs of the third array of latches are synchronous data outputs of the Asynchronous Digital to Synchronous Digital Converter.

12. The Asynchronous Digital to Synchronous Digital Converter of claim 11 in combination with a pulse domain demultiplexer receiving a pulse domain signal, the pulse domain demultiplexer comprising:
    a control stage connected to an input of the demultiplexer, the control stage comprising:
        (i) a counter with a single input, no clock input and a multi-bit asynchronous output, the counter incrementing when it detects an edge in an inputted pulse sequence at said single input; and
        (ii) a logic block connected to an output of the counter and implementing asynchronous Boolean operations; and
    a deMUX logic switch block comprising: an array of logical 'AND' gates, each gate having two inputs, a first input receiving the pulse sequence and a second input receiving a control signal from logic block, wherein outputs of the 'AND' gates provide time interleaved asynchronous pulses at a lower frequency than the pulse signal received by the pulse domain demultiplexer,
    wherein an output of said counter provides said counter output to said logic block.

13. A Time Reference Circuit comprising:
    a logic block connected to a counter output, the logic block implementing asynchronous Boolean operations based the output of said counter;
    an AND logical asynchronous gate having one input for receiving an input pulse signal from a time encoder and having another input receiving a control signal from the logic block;
    an OR logical gate having one input which receiving an output of the AND gate and having another input which receives a control signal from the logic block;
    a 1-bit DAC connected to received an output of said OR logical gate;
    an integrator receiving an output of the 1-bit DAC, the integrator being reset by a control signal from the logic block; and
    a synchronous ADC having a sampling frequency higher than a maximum asynchronous frequency of the input pulse signal.

14. The Time Reference Circuit of claim 13 in combination with a pulse domain demultiplexer receiving a pulse domain signal, the pulse domain demultiplexer comprising:
    a control stage connected to an input of the demultiplexer, the control stage comprising:
        (i) a counter with a single input, no clock input and a multi-bit asynchronous output, the counter incrementing when it detects an edge in an inputted pulse sequence at said single input; and
        (ii) a logic block connected to an output of the counter and implementing asynchronous Boolean operations; and
    a deMUX logic switch block comprising: an array of logical 'AND' gates, each gate having two inputs, a first input receiving the pulse sequence and a second input receiving a control signal from logic block, wherein outputs of the 'AND' gates provide time interleaved asynchronous pulses at a lower frequency than the pulse signal received by the pulse domain demultiplexer,
    wherein an output of said counter provides said counter output to said logic block.

* * * * *